United States Patent [19]
Kubo

[11] Patent Number: 5,840,116
[45] Date of Patent: Nov. 24, 1998

[54] METHOD OF GROWING CRYSTALS

[75] Inventor: Takayuki Kubo, Nishinomiya, Japan

[73] Assignee: Sumitomo Sitix Corporation, Amagasaki, Japan

[21] Appl. No.: 933,987

[22] Filed: Sep. 19, 1997

Related U.S. Application Data

[63] Continuation of Ser. No. 413,617, Mar. 30, 1995, abandoned.

[30] Foreign Application Priority Data

Mar. 31, 1994 [JP] Japan ................................. 6-063614

[51] Int. Cl.⁶ .................................................. C30B 15/12
[52] U.S. Cl. ................................. 117/20; 111/30; 111/32; 111/33; 111/932
[58] Field of Search ................................. 117/20, 30, 32, 117/33, 932

[56] References Cited

U.S. PATENT DOCUMENTS

| | | | |
|---|---|---|---|
| 4,565,671 | 1/1986 | Matsutani et al. | 117/917 |
| 4,592,895 | 6/1986 | Matsutani et al. | 117/917 |
| 4,637,854 | 1/1987 | Fukuda et al. | 117/917 |
| 4,659,423 | 4/1987 | Kim et al. | 117/32 |
| 5,152,867 | 10/1992 | Kitaura et al. | 117/20 |
| 5,178,720 | 1/1993 | Frederick | 117/20 |

FOREIGN PATENT DOCUMENTS

| | | | |
|---|---|---|---|
| 4204777 A1 | 10/1992 | Germany . | |
| 34-8242 | 9/1959 | Japan . | |
| 55-126597 | 9/1980 | Japan . | |
| 56-45889 | 4/1981 | Japan . | |
| 56-104791 | 8/1981 | Japan . | |
| 59-102893 | 6/1984 | Japan | 117/20 |
| 60-33298 | 2/1985 | Japan | 117/20 |
| 61-205691 | 9/1986 | Japan . | |
| 61-215285 | 9/1986 | Japan . | |
| 63-252989 | 10/1988 | Japan . | |
| 01282185 | 11/1989 | Japan | 117/32 |
| 03-012389 | 1/1991 | Japan . | |
| 5-24972 | 2/1993 | Japan . | |

OTHER PUBLICATIONS

*Oxygen in Czochralski silicon crystals grown under an axial magnetic field,* J. Crystal Growth, vol. 121, No. 4, Aug. 1992, Amsterdam., Sclnick.

*Primary Examiner*—Robert Kunemund
*Attorney, Agent, or Firm*—Burns, Doane, Swecker & Mathis, LLP

[57] ABSTRACT

A process of growing crystals in which the uniformity of the oxygen concentration is desirable. In the process, the upper part of the material in the crucible is heated to form a molten layer, and a solid layer is formed at its lower part, then a seed crystal is made to contact the surface of the molten layer, and pulled up to grow a crystal, while characteristically a magnetic field is applied to the molten layer. This method produces single crystals with a uniform distribution of oxygen concentration. Furthermore, this method produces single crystals at low cost and with a high productivity.

9 Claims, 5 Drawing Sheets

F I G. 4
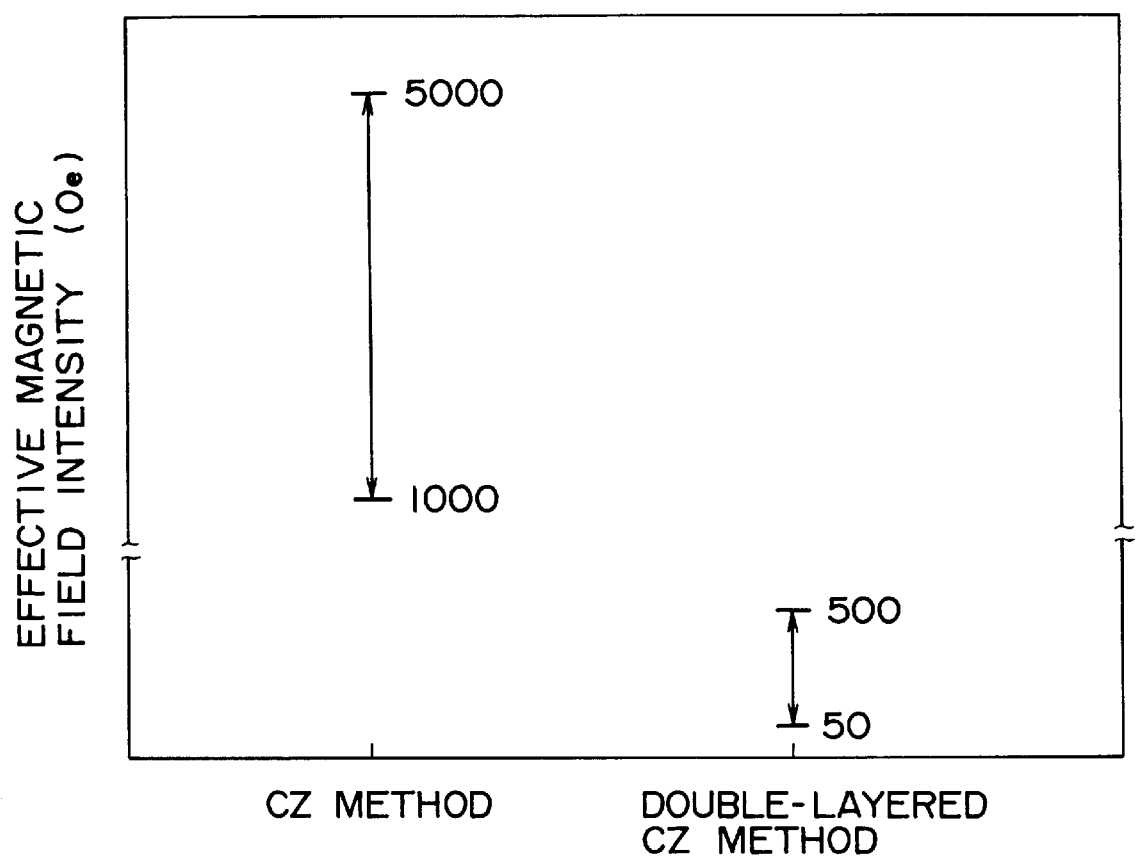

METHOD OF GROWING CRYSTALS

This application is a continuation of application Ser. No. 08/413,617, filed Mar. 30, 1995 now abandoned.

FIELD OF THE INVENTION

The present invention relates to a method of growing crystals by rotary pulling, and, furthermore, to a method of growing silicon single crystals to be used as the raw material for semi conductors, which is of adequate crystalline characteristics particularly with uniform distribution of oxygen concentration.

DESCRIPTION OF THE PRIOR ART

Among a number of methods of growing single crystals, a rotary pulling method known as the Czochralski process (CZ process) enables mass production of single crystals and is widely applied in industry.

FIG. 5 illustrates the cross section of the process according to the conventional method of rotary pulling (Czochralski process). Crucible 1 comprises a dual layered combination of an inside crucible 1a, which is made of quartz in the form of a cylinder with a bottom and an outside suscepting graphite crucible 1b, which is tightly fit to the crucible la and made of graphite in the form of a cylinder with a bottom. A resistance heating element 2 and a heat insulating cylinder 11 are concentrically mounted outside the crucible 1. Molten material for the crystal, namely the melt 7 of the crystal material, is charged in the quartz crucible 1a. A pulling wire 13, which is rotated at a certain rate for example, is installed along the central axis of the dual structured crucible 1, which is further supported by the crucible shaft 12 installed concentrically with the pulling wire 13 and rotated at a prescribed rate. These parts and components are contained in a chamber 14, altogether constituting a rotary pulling apparatus.

With the apparatus of this constitution, a seed crystal 3, which is mounted at the lower tip of the pulling wire 13 is lowered until it makes contact with the surface of the melt 7, and then pulled upward as it is rotated at a rate adjusted to the growth of the crystal in order to grow a single crystal 6, which is solidified from the melt 7 of the material.

When a single crystal is grown by rotary pulling technique for semiconductor use, a certain dose of impurity elements (dopant) is added to the melt prior to pulling in order to adjust the electric characteristics of the grown crystal, such as electric resistance and the type of electric conduction. Since, however, the ratio of melting of impurity elements into the single crystal is not uniform from the beginning through the end of the crystal growth, segregation of added impurities along the direction of crystal growth is observed, resulting in difficulty to obtain uniform electric characteristics.

Occurrence of segregation of impurities in the crystal is caused by the effective coefficient of segregation Ke, the ratio of the impurity concentration at the beginning of solidification to that at its end, not being equal. The effective coefficient of segregation Ke may also be expressed by the ratio of the impurity concentration in the crystal $C_s$ to that in the melt $C_L$ ($C_S/C_L$) at the boundary between the melt and the crystal when the crystal is grown. If the coefficient Ke does not equal 1.0, it results that the impurity concentration in the melt, consequently that in the crystal varies as it grows. For example, if Ke is less than 1.0, the impurity concentration in the melt increases as the crystal grows. Consequently, the impurity concentration in the later part of the crystal growth (lower part along the crystal length) will be higher.

Double-layered CZ method is applied to growing crystals by rotary pulling as mentioned above while suppressing the impurity segregation in the crystal.

FIG. 2 illustrates a cross section of the basic constitution of the double-layered CZ method. FIG. 2 demonstrates that a molten layer 4 in the upper part and a solid layer 5 at the bottom are formed by melting the upper part of the material charged in the crucible 1 with the heating element 2 as explained in relation to the Czochralski method. Then the seed crystal 3 is made to contact the molten layer 4, and the crystal 6 solidified from the melt of the material is pulled up with the pulling wire 13 as it is rotated.

Two methods as mentioned below are applied in the double-layered Czochralski method to suppress segregation of the impurities in the crystal.

The first method is to maintain the quantity of the material in the molten layer in the crucible stable, while the crystal is grown, namely, as the pulling wire is pulled up (constant molten layer method), which has been disclosed in Japanese Patent Application No. 32-16224, and Japanese Patent Application No. 54-33870. In accordance with this method, the solid layer containing fewer impurities is continually supplied to the melt as the crystal is grown irrespective of the values of the effective coefficient of segregation Ke. Therefore, the impurity concentration $C_L$ in the molten layer is reduced and can be kept at a relatively steady level.

The second method is to maintain the impurity concentration at a constant level by intentionally varying the quantity of the melt constituting the molten layer instead of addition of impurities to the melt (variable molten layer thickness method), as has been disclosed in Japanese Patent Application No. 60-45602, and Japanese Patent Application No. 60-57174.

Controlling the thickness of the molten layer is carried out by adequately selecting previously the length of the source of heat; the thermal input and the crucible dimensions (especially the length), and the shape and the material of the heat insulating cylinder which is installed outside the heating element to enhance the heat transfer at the lower portion in the crucible.

While a silicon crystal, which is most widely used for the single crystal for semiconductor use, is grown by the method of rotary pulling, oxygen that has dissolved into the melt from the quartz crucible during pulling is taken into the crystal. The single crystal thus enriched with oxygen is less prone to slips and burring during repeated heat treatment in the device process. The internal precipitates of oxygen generate high density stacking faults during heat treatment at about 1000° C., and act to reduce the crystalline defects and the impurities of heavy metals in the surface area of the wafer (so called intrinsic gettering), playing a very important role in producing the clean wafer surface layer free of defects.

However, unless the oxygen concentration in the crystal is controlled with appropriate accuracy, oxygen precipitation will have an adverse effect of becoming a principal cause of crystalline defects. Consequently, in growing a silicon crystal for semiconductor use, controlling the oxygen concentration in the crystal; homogenizing its density distribution, is an issue of critical importance.

Oxygen which is brought into the pulled crystal is supplied by the inside surface of the quartz crucible in direct contact with the melt. Although the oxygen dissolved into the melt from the surface of the quartz crucible is mostly discharged into the atmosphere of pulling through the surface of the melt in the form of SiO gas, part of the oxygen is transferred to the boundary of crystal growth by the flow of convection and taken into the crystal. Therefore, effective means to homogenize the oxygen concentration in the crystal are suppressing convection within the melt and also reducing the area of contact between the melt and the quartz crucible.

From the above point of view, a method of imposing magnetic field upon the melt in the crucible, in the Czochralski method, has been proposed (see, for example, Japanese Patent Application No. 55-8578, and Japanese Patent Application No. 54-121339) in order to reduce the oxygen taken into the crystal by suppressing convection in the melt and further homogenizing the oxygen distribution. These methods enable to grow crystals with low oxygen content and uniform radial distribution of oxygen. However, if they are to be applied to industrial production, a new source of magnetic field and an apparatus to apply it are required to be prepared, and a large additional running cost for the electric power to generate and apply the magnetic field has to be counted for. For this reason, the method of applying magnetic field to the melt has not been realized in the Czochralski method when it is practiced in industrial application.

It has been hard to secure low and homogeneous radial distribution of oxygen concentration by the double-layered CZ method, while it is easy to grow a crystal with uniform oxygen concentration in the direction of the crystal growth. A method of increasing the rate of revolution of the crucible has been proposed to accomplish it. Rotating the crucible suppresses convection in the melt, and the effect becomes highly desirable with the double-layered CZ method which maintains a solid layer at the bottom of the crucible. It is claimed that, therefore, convection is suppressed as the rate of revolution of the crucible is increased enough to decrease the oxygen concentration in the pulled crystal (see Japanese Patent Application No. 3-26261). Certainly, with this procedure, a crystal can be grown by the double-layered CZ method maintaining uniform radial distribution of oxygen concentration.

However, rotating the crucible at a specific rate gives rise to a remarkable temperature variation in the melt when the double-layered CZ method is applied. Therefore, generation of dislocations in the grown crystal has been a problem in the early stage of the crystal growth (in the stage of so called neck process or shoulder process) which is particularly susceptible to variation in the liquid temperature.

Since the average temperature of the molten layer varies remarkably, if the rate of revolution of the crucible varies for a long period, even during the crystal pulling past the initial stage of the crystal growth, the temperature of the melt would be unstable with the variation in the revolution of the crucible. Therefore, control of the crystal during the crystal growth (for example, control of the crystal diameter, etc.) is not effected, and problems are raised such that the operator is bound to monitor the process for a long period or the quality of the pulled crystal is affected.

With those problems as mentioned above, it has been difficult with the conventional double-layered CZ method to grow a crystal securing uniform oxygen concentration throughout a wide range in the crystal, including the radial direction in the crystal cross section as well as the direction of the crystal growth.

OBJECTS OF THE INVENTION

The objects of this invention are to solve problems related with the conventional method of rotary pulling for growing crystals, to establish a method of growing crystals securing uniform oxygen concentration throughout a wide range in the grown crystal. Furthermore, it can be seen that this invention reduces production cost while increasing productivity of manufacturing single crystal.

SUMMARY OF THE INVENTION

In summary, this invention of the method of growing crystals with superior oxygen concentration uniformity is characterized by applying magnetic field upon the molten layer 4 which is formed in the upper part of the material in the crucible 1, in the process of growing a crystal 6 by pulling up a seed crystal 3 after lowering it to contact the surface of the melt 4 mentioned above, the lower part of which is a solid layer 5, as shown in FIG. 1.

The intensity of the magnetic field to be applied to the molten layer should desirably be low as in the range from 100 Oe to 500 Oe. Variation in temperature at the center of the molten layer surface is characteristically below 2.0° C. per minute. The oxygen concentration in the grown single crystal is also characteristically below $10 \times 10^{17}$ atoms/cm$^3$.

BRIEF DESCRIPTION OF THE DRAWINGS

FIG. 4 shows a comparison between the effective intensity of the applied magnetic field by the Czochralski method and that by the method in accordance with this invention.

DETAILED DESCRIPTION OF THE INVENTION

The present inventors investigated the detailed relationships between the rate of revolution of the crucible and the conditions of application of the magnetic field to the molten layer in order to solve the problem in controlling the oxygen concentration with the double-layered CZ method that the variation in temperature of the melt increases when the crucible is rotated at a specific rate of revolution.

It has been found, consequently, that the variation in temperature in the surface of the molten layer can be kept under control by applying magnetic field even at a high rate of revolution (number of revolutions, rpm) that would have caused variation in the liquid temperature. It has been found further that by having the variation of the liquid temperature under control, the radial distribution of oxygen taken into the crystal as well as the concentration distribution of other impurity elements is made uniform.

This invention has been accomplished based on the above mentioned findings, characterized by application of magnetic field to the melt itself in the molten layer in accordance with the double-layered CZ method. However, the magnetic field applied in accordance with this invention will not cause a large expense in the production process, because a magnetic field of high intensity is not required as is for the conventional Czochralski process. In other words, in the present invention, the applied magnetic field is desirable to be of less intensity than 500 Oe, in consideration of the cost of production and the productivity of manufacturing of the single crystals. However, its lower bound is limited to be 100 Oe in view of suppressing the variation in liquid temperature. A magnetic field of 200 Oe to 500 Oe is even more desirable in order to suppress convection of the melt sufficiently in addition to the effect of suppressing convection of the double-layered CZ method.

While there are various types of application of magnetic field such as transverse field type, longitudinal field type, cusp type, and so on, there is no limitation of the type to be applied.

EXAMPLES ACCORDING TO INVENTION

Figure 1:
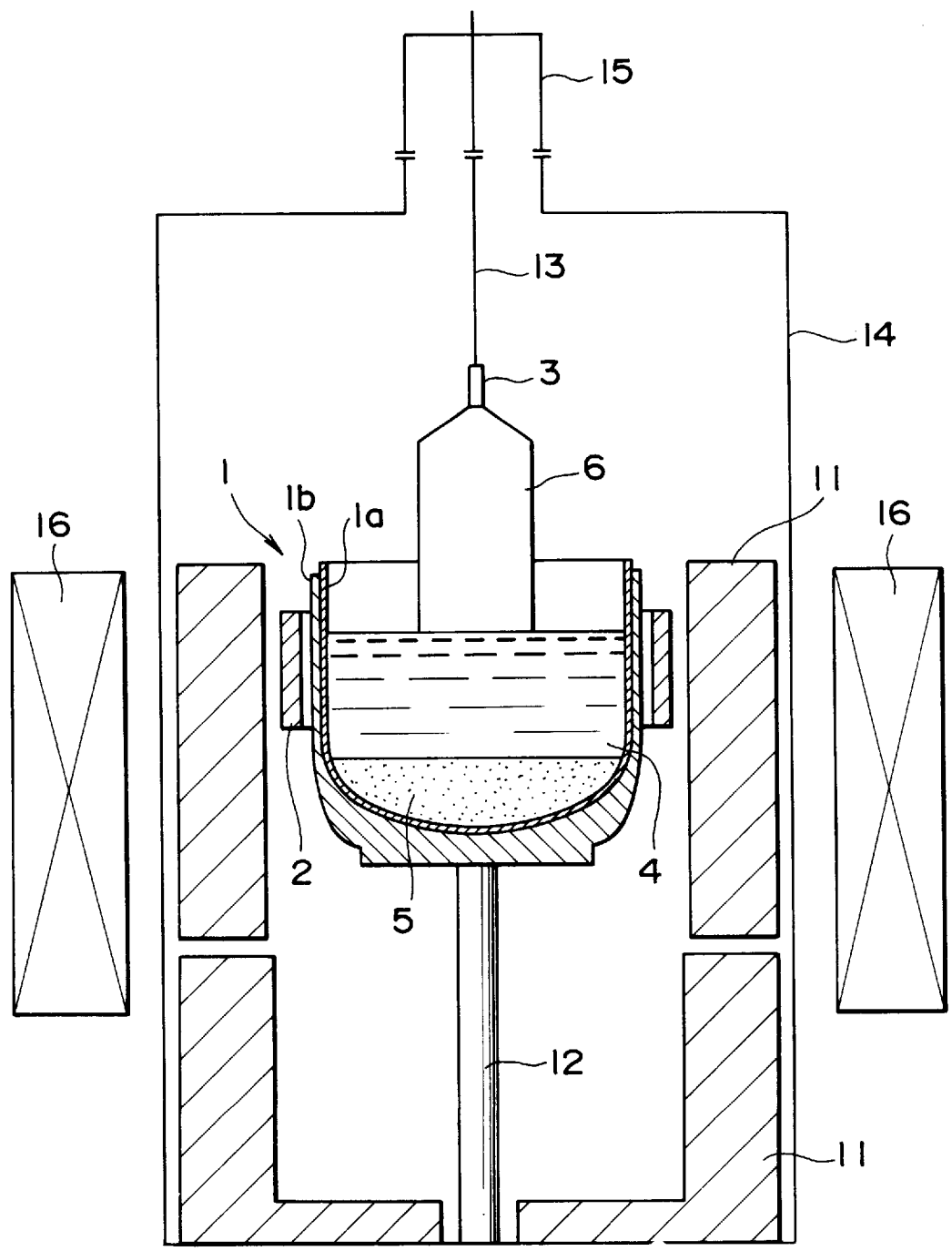
FIG. 1 illustrates a schematic section of an example of an apparatus in accordance with this invention.
Figure 2:
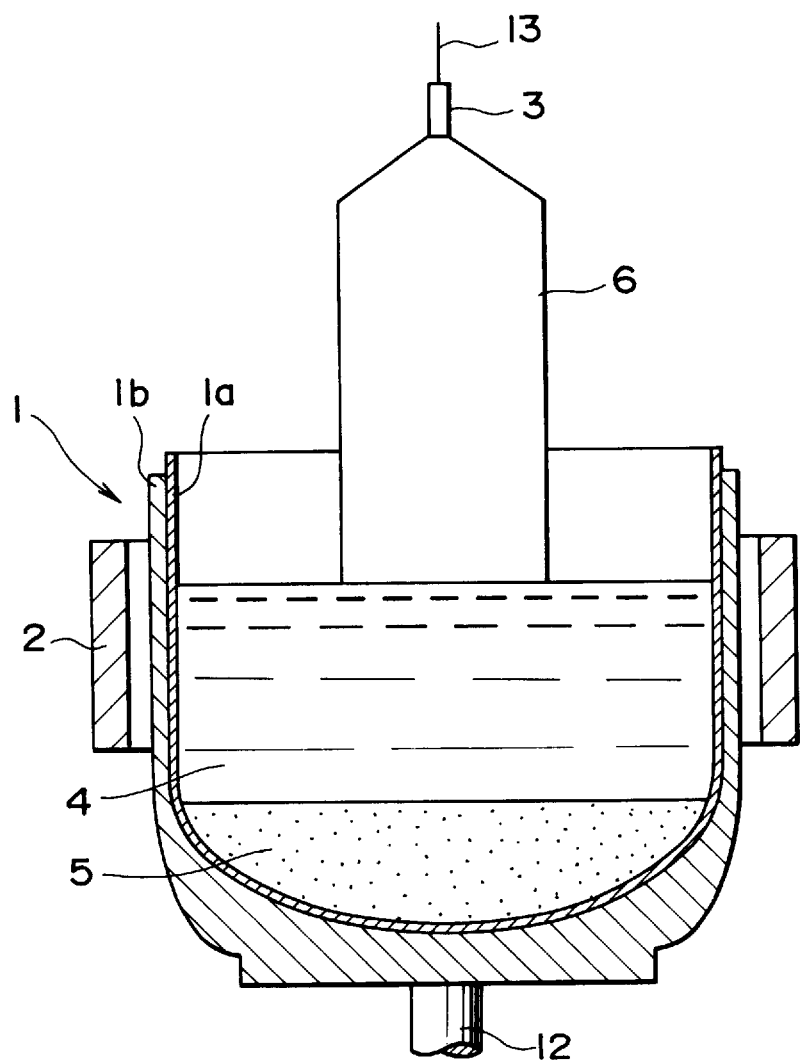
FIG. 2 illustrates a schematic section which shows the basic structure of the apparatus in accordance with the double-layered CZ method.

In the schematic drawing in FIG. 1 of the cross section of an example of the apparatus in accordance with this invention, chamber 14 consists of a cylindrical vacuum vessel placed vertically along the direction of crystal growth, and is cooled with a water cooling mechanism which is not shown in this drawing. Crucible 1 comprises an inside crucible 1a which is made of quartz in the form of a cylinder with a bottom and an outside suscepting graphite crucible 1b which is tightly fit to the crucible 1a, and the crucible 1 is positioned at the center of chamber 14. A crucible shaft 12 for revolution, ascent, and descent of the crucible is connected to the bottom of the crucible susceptor 1b, and a resistance heating element 2 with a short heating range of, say, about 90 mm is constituted surrounding the crucible 1 concentrically with the pulling wire 13. In the double-layered CZ method, for example, adjusting the relative position between the heating element and the crucible, or adjusting the power input to the heating element can control the respective quantities of the molten layer 4 and the solid layer 5 in the crucible. A heat insulating cylinder 11 is mounted surrounding the heating element 2.

On the other hand, a pulling wire 13 is suspended above the crucible 1 through a guard cylinder 15 which is a cylindrical small diameter extension upon the chamber 14. The pulling wire is made feasible to be rotated, raised, and lowered also, at the end of which is mounted a seed crystal 3. The seed crystal is descended so as to have its lower end contact the surface of the molten layer 4 and then is pulled up as it is rotated to grow a crystal 6 from its lower end.

A simple magnetic field generating apparatus of transverse field type 16 is installed outside the chamber 14 with its axis coinciding with that of the pulling wire.

Advantages of the method in accordance with this invention in comparison with the conventional method (double-layered CZ method or Czochralski method) will be explained by growing silicon single crystals in accordance with this invention and with the Czochralski method for comparison.

The following conditions were applied to grow silicon single crystals in accordance with this invention, and silicon single crystals were also grown in accordance with the double-layered CZ method without application of magnetic field for the purpose of comparison.

[1] Charging the starting material:

A crucible was constructed by fitting an inside quartz vessel (400 mm inside diameter with 350 mm depth) to an outer graphite susceptor, and the material for the crystal, high purity silicon polycrystals weighing 65 kg, was loaded in the crucible.

0.6 g of phosphorus-silicon alloy was added to the material above as a dopant material of n-type.

[2] Preparation for the double-layered CZ method:

Inside air in the chamber was replaced with an argon atmosphere of 10 Torr, and after melting the material by setting the heating power at 75 kW, the heating power of the heating element was reduced to 60 kW in order to grow a solid layer below the molten layer.

[3] Initial stage of crystal growing by the double-layered CZ method:

After growing the solid layer sufficiently and stabilizing the molten layer, four conditions of crucible revolution were chosen to be 0, 5, 10, and 15 rpm, with the constant rate of revolution of the pulling wire set at 10 rpm in the reverse direction, and the lower tip of the seed crystal was dipped into the molten layer.

When the magnetic field was to be applied, it was applied to the molten layer by setting the magnetic field of a magnetic field generating apparatus with simple construction at predetermined intensities (50 Oe, 100 Oe, 200 Oe, 500 Oe, and 2000 Oe) in the early stage of growth of the single crystal, i.e., before the onset of the neck process.

[4] Growth of crystal by the double-layered CZ method:

After the initial stage of the growth of a single crystal (completing neck process—forming the shoulder—changing the shoulder), a body process followed to grow a defect-free single crystal of 6 inch diameter with the length of up to 1000 mm.

The relationship between the intensity of the magnetic field and the variation in the liquid temperature was investigated in order to confirm the uniformity of the crystal surface in the radial direction. The results are shown in Table 1. Here, the temperature variation in the melt means the temperature variation on the surface of the melt, and is represented by (The highest liquid surface temperature— The lowest liquid surface temperature) in a unit time (one minute) at the center of the molten liquid surface.

TABLE 1

| Magnetic field intensity (Oe) | Crucible revolution (rpm) | Temperature variation in melt (°C.) |
|---|---|---|
| 0 (No application) | 5 | 20.0 |
|  | 15 | 30.0 |
| 50 | 5 | 7.0 |
|  | 15 | 10.0 |
| 100 | 5 | 2.0 |
|  | 15 | 2.0 |
| 200 | 5 | 1.0 |
|  | 15 | 1.0 |
| 500 | 5 | 2.0 |
|  | 15 | 2.0 |
| 2000 | 5 | 4.0 |
|  | 15 | 5.0 |

Note: Temperature bariation indicates that in a unit time (one minute) at the center of the liquid surface.

As it is clearly seen from Table 1, the variation in the liquid surface temperature can effectively be kept under control by applying the magnetic field of low intensity but above 100 Oe to the molten layer. Nevertheless, its effect is saturated beyond 500 Oe, or convection in the melt is generated by the magnetic field, hence it is recognized that application of a low magnetic field below 500 Oe is desirable.

Figure 3:
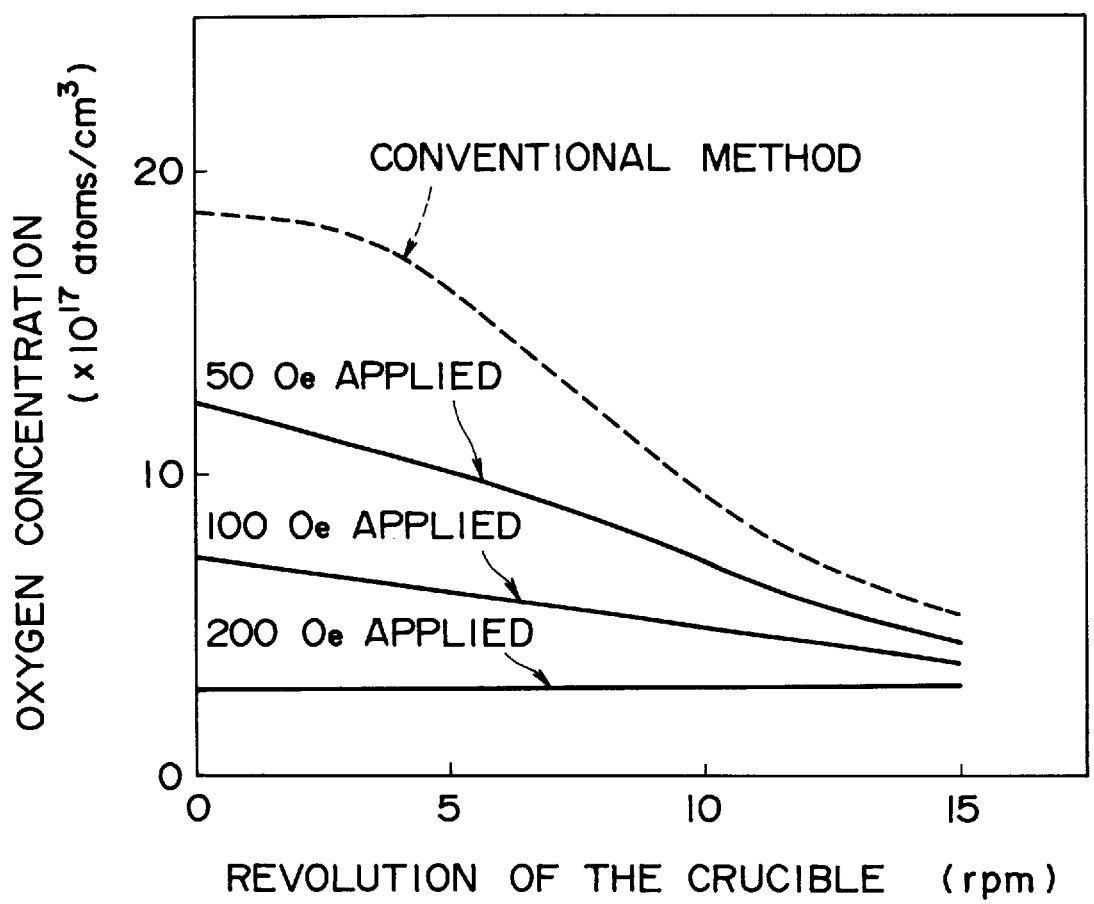
FIG. 3 shows the relationship between the rate of revolutions of the crucible and the oxygen concentration in the crystal produced by the double-layered CZ method (with and without application of magnetic field).
Figure 5:
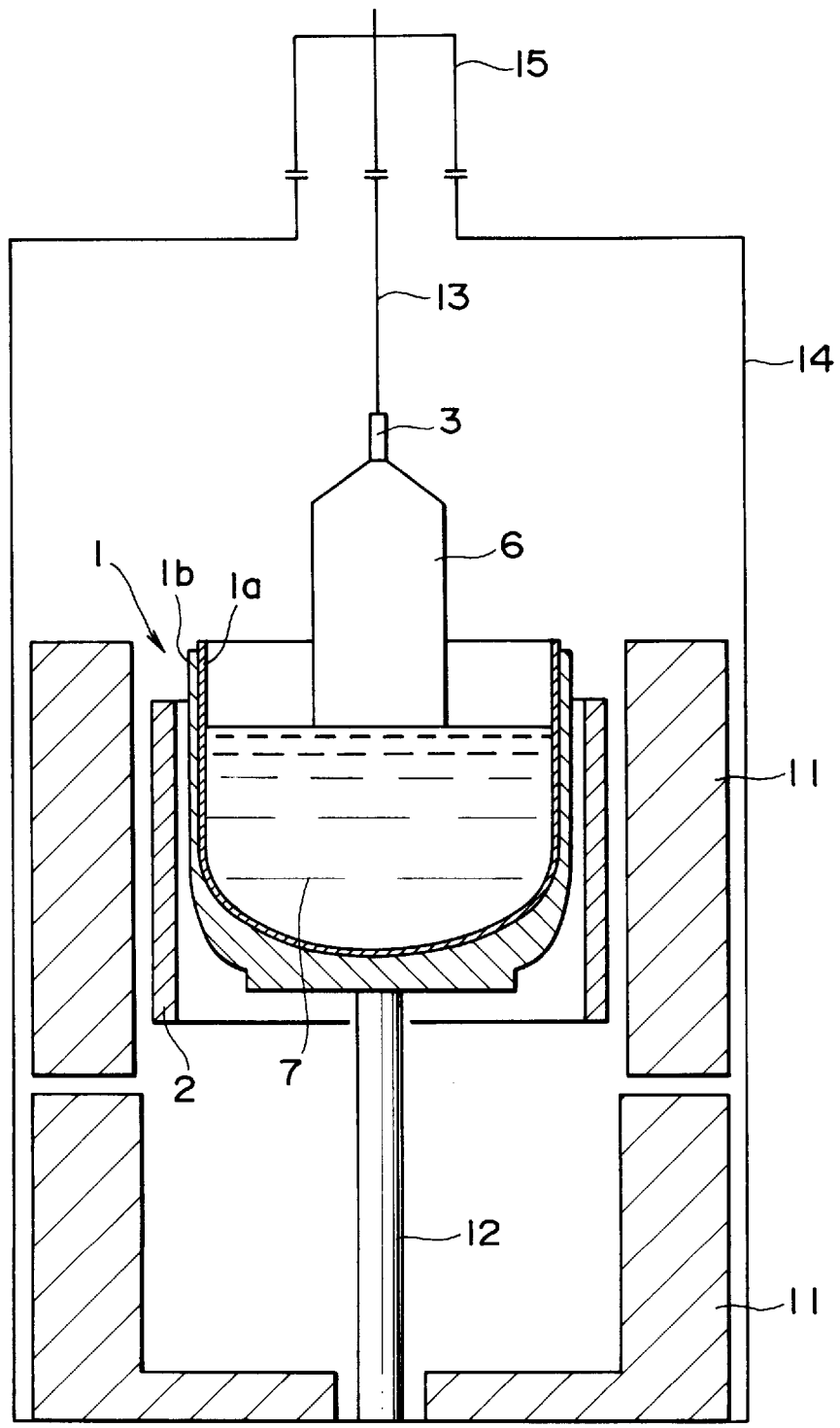
FIG. 5 illustrates a schematic cross section of a process of producing a crystal in accordance with the conventional rotary pulling method (Czochralski method).

Next, the relationship between the number of revolution of the crucible and the oxygen concentration in the crystal was investigated, and the result is shown in FIG. 3. The intensity of magnetic field varied at three levels of 50 Oe, 100 Oe, and 200 Oe was applied according to this invention, while magnetic field was applied in the case in accordance with the conventional double-layered CZ method. The concentration of oxygen in a cross section of the crystal was determined at the center of the crystal cross section for every planned number of revolution and with both methods.

It can be observed in FIG. 3 that the concentration of oxygen is relatively stable irrespective of the number of revolutions of the crucible with the method in accordance with this invention. On the other hand, with the conventional method without application of a magnetic field, the oxygen concentration depends on the number of revolutions of the crucible and remarkably increases below 10 rpm. This tendency becomes more apparent with increasing intensity of the applied magnetic field, and is saturated with the magnetic field above 200 Oe for the number of the revolution of the crucible between 0 to 15 rpm.

COMPARATIVE EXAMPLE

Silicon single crystals were grown in accordance with the Czochralski method with application of a magnetic field to the melt in the crucible. The conditions are as stated below with other conditions that are not mentioned being the same as the example of the embodiment of the invention.

[1] Charging the starting material

The material for the crystal, 40 kg of high purity silicon polycrystals was charged in a crucible of a similar construction as the example of the embodiment (400 mm in diameter with 350 mm depth).

[2] Conditions of growing crystals in accordance with Czochralski method:

The revolution of the crucible was set at 15 rpm and that of the pulling wire was set at 10 rpm in the reverse direction.

A single crystal of 6 inch diameter was grown to the length of 1000 mm free of defects, with the intensity of the magnetic field applied to the melt varying between 0 and 5000 Oe.

The effective intensity of the applied magnetic field in accordance with this invention was compared with that in accordance with Czochralski method based on the results of the embodiment and the comparison. The effective intensity of the applied magnetic field stands for the intensity of the applies magnetic field with which a crystal with oxygen concentration below $5 \times 10^{17}$ atoms/cm³ can be grown.

FIG. 4 shows the results of comparison between the effective intensity of the magnetic field applied to this invention and that to the Czochralski method (with the crucible revolution at 15 rpm and the pulling wire revolution at 10 rpm for both cases), and the results indicate the comparison of difficulty and ease in applying magnetic field to the double-layered CZ method and to Czochralski method (The method in accordance with this invention is represented by "double-layered CZ method" and the Czochralski method is by "CZ method" in FIG. 4.).

It can be clearly seen in FIG. 4 that the method in accordance with this invention can be utilized with application of a lower magnetic field than the Czochralski method can be utilized with. Therefore the method in accordance with this invention can be applied in the process of producing single crystals at low cost.

The above examples were described for growing silicon single crystals, but the method in accordance with this invention is also applicable to growing single crystals of other material than silicon.

As has been explained as above, this invention offers the method of producing single crystals with uniform distribution of oxygen concentration in the radial direction as well as in the direction of the crystal growth. Furthermore, this invention produces silicon single crystals at low cost and at a high productivity.

What is claimed is:

1. In a process of growing single crystals by the double-layered CZ method in which the upper part of material in a crucible is heated to form a molten layer, and a solid layer is formed with its lower part, a seed crystal is made to contact a surface of said molten layer then pulled up to grow a crystal, which is characterized by applying a low magnetic field of between 100 Oe and 500 Oe to said molten layer to produce crystals of uniform oxygen concentration in the radial and crystal growing directions.

2. A process of growing crystals according to claim 1, in which variation in the temperature at the center of said molten layer is characteristically controlled to below 2.0° C. per minute.

3. A process of growing crystals according to claim 1, which characteristically maintains the oxygen concentration below $10 \times 10^{17}$ atoms/cm³.

4. A process of growing crystals according to claim 1, which characteristically controls the intensity of the magnetic field to the molten layer in the range of 100 Oe to 500 Oe, and maintains the oxygen concentration below $10 \times 10^{17}$ atoms/cm³.

5. A process of growing crystals according to claim 1, wherein the crucible and seed crystal are rotated in opposite directions.

6. A process of growing crystals according to claim 1, wherein the crucible is rotated at speeds up to 15 rpm and the seed crystal is rotated in a direction opposite to that of the crucible.

7. A process of growing crystals according to claim 1, wherein the crucible and seed crystal are rotated in opposite directions and at different speeds of rotation.

8. A process of growing crystals according to claim 1, wherein during the crystal growing process the magnetic field is adjusted such that variation of temperature in the surface of the molten layer is controlled to provide a uniform radial distribution of oxygen.

9. A process of growing crystals according to claim 1, wherein during the crystal growing process a silicon single crystal is grown.

* * * * *